(12) United States Patent
Malmberg et al.

(10) Patent No.: US 7,522,427 B2
(45) Date of Patent: Apr. 21, 2009

(54) ELECTRICAL MODULE

(75) Inventors: Leif Malmberg, Halmstad (SE); Staffan Dahlström, Harplinge (SE); Niklas Eliasson, Simlängdalen (SE)

(73) Assignee: HMS Industrial Networks AB, Halmstad (SE)

( * ) Notice: Subject to any disclaimer, the term of this patent is extended or adjusted under 35 U.S.C. 154(b) by 332 days.

(21) Appl. No.: 11/147,264

(22) Filed: Jun. 8, 2005

(65) Prior Publication Data

US 2005/0282416 A1 Dec. 22, 2005

(30) Foreign Application Priority Data

Jun. 15, 2004 (SE) .................................. 0401532

(51) Int. Cl.
*H05K 7/14* (2006.01)

(52) U.S. Cl. .................. 361/801; 361/759; 361/192; 361/193; 361/194; 361/796

(58) Field of Classification Search ............ 361/54, 361/726, 737, 747, 740, 752, 759, 796, 801, 361/192–194; 398/115, 117, 135; 370/498, 370/537; 720/691, 719
See application file for complete search history.

(56) References Cited

U.S. PATENT DOCUMENTS

| 3,506,883 | A | * | 4/1970 | Sugiyama | 361/194 |
| 3,873,892 | A | * | 3/1975 | Dettling et al. | 361/192 |
| 5,432,682 | A | * | 7/1995 | Giehl et al. | 361/796 |
| 5,575,163 | A | * | 11/1996 | Kohl et al. | 70/58 |
| 5,909,815 | A | * | 6/1999 | Kato et al. | 209/653 |
| 5,999,294 | A | * | 12/1999 | Petsko | 398/115 |
| 6,005,700 | A | * | 12/1999 | Pressler et al. | 398/117 |
| 6,097,605 | A | * | 8/2000 | Klatt et al. | 361/737 |
| 6,160,717 | A | | 12/2000 | Desousa et al. | |
| 6,272,004 | B1 | * | 8/2001 | McDermott | 361/600 |
| 6,297,725 | B1 | * | 10/2001 | Tischendorf et al. | 340/5.64 |

(Continued)

FOREIGN PATENT DOCUMENTS

DE 1282756 7/1966

(Continued)

OTHER PUBLICATIONS

International-Type Search Report.

*Primary Examiner*—Dean A. Reichard
*Assistant Examiner*—Xiaoliang Chen
(74) *Attorney, Agent, or Firm*—Harness, Dickey & Pierce P.L.C.

(57) ABSTRACT

The invention relates to an electrical module, comprising a first electrical interface, said module being attachable to an electrical device for connecting said first electrical interface to said device. The electrical module is characterised by at least one locking device adapted to prevent movement of said module in relation to said electrical device in at least one direction, said locking device comprising a first part which is movable along a first axis and a second part which is turnable about a second axis, the second part being movable to a locking position by turning about said second axis in response to linear movement of the first part along said first axis, said second axis having an extension which is different from the extension of said first axis, and said second part being adapted for engagement with said electrical device in said locking position.

19 Claims, 2 Drawing Sheets

U.S. PATENT DOCUMENTS

| | | | |
|---|---|---|---|
| 6,549,424 B1 * | 4/2003 | Beseth et al. | 361/801 |
| 6,614,811 B1 * | 9/2003 | Alaimo et al. | 370/498 |
| 2001/0036145 A1 * | 11/2001 | Otani et al. | 369/219 |
| 2002/0037658 A1 * | 3/2002 | Ozawa | 439/159 |
| 2002/0090846 A1 * | 7/2002 | Abboud | 439/76.1 |
| 2003/0057713 A1 * | 3/2003 | Cowper | 292/63 |
| 2005/0111201 A1 * | 5/2005 | Suekawa et al. | 361/732 |
| 2005/0184546 A1 * | 8/2005 | Kunz et al. | 296/26.01 |

FOREIGN PATENT DOCUMENTS

| | | |
|---|---|---|
| JP | 11159842 A | 9/1999 |
| WO | WO 03092346 | 6/2003 |

\* cited by examiner

ELECTRICAL MODULE

FIELD OF THE INVENTION

This invention is related to an electrical module, comprising a first electrical interface, said module being attachable to an electrical device for connecting said first electrical interface to said device.

DESCRIPTION OF RELATED ART

Since electrical modules continue to develop in the computer industry, there is an increasing need for attachment of such modules in an electrical device after the electrical device has been assembled. Also, as these electrical modules develop there is a need to replace existing modules with a later version of that module or with a module with another function.

Accordingly, there is a need for an easy and secure way to attach an electrical module to an electrical device and thereby connect an electrical interface of said module to a corresponding electrical interface of the electrical device.

A known way to attach a module to a device is to attach the module by screws in threaded holes on the device. This way to attach the module has the drawback that the device has to comprise threaded holes, which cooperate with and coincide with the positioning of the screws on the module. Further, another problem with this way of attachment is that the device has to be opened to attach the module, via the screws, to the electrical device.

Another known way to attach an electrical module to an electrical device is to use a snap lock. This way to attach the module to the device involves the need to modify the device so that it is equipped with a male or a female part of the snap lock. Further, if a module should be removed there is often a need for special tools to unlock the snap lock.

Another problem with these known ways of attachment is that the electrical interface is exposed to forces that can damage said electrical interface.

SUMMARY OF THE INVENTION

It is therefore an object of the present invention to provide an electrical module that is attachable to an electrical device in an easy way.

It is a further object of the present invention to provide an electrical module which is attachable to an electrical device without the need of opening the electrical device.

Another object of the present invention is to provide an electrical module which may be attached to an electrical device in a secure way, whereby the electrical interface of the module and the device are not damaged.

These and other objects have been achieved by providing an electrical module, comprising a first electrical interface, said module being attachable to an electrical device for connecting said first electrical interface to said device. The electrical module is characterised by at least one locking device adapted to prevent movement of said module in relation to said electrical device in at least one direction, said locking device comprising a first part which is movable alone a first axis and a second part which is turnable about a second axis, the second part being movable to a locking position by turning about said second axis in response to linear movement of the first part along said first axis, said second axis having an extension which is different from the extension of said first axis, and said second part being adapted for engagement with said electrical device in said locking position.

An advantage of the electrical module according to the present invention is that it may be attached to an electrical device without the need of opening the device.

A further advantage of the electrical module according to the present invention is that it provides a way to attach and reattach the module to many different electrical devices, which devices only need minor adaptation to cooperate with said module.

Another advantage of the inventive electrical module is that it provides a module that may be attached to a device in a secure and reliable way.

Another advantage of the inventive electrical module is that it provides a module that may be attached to a device in such a way that the electrical interface of the module and the device are connected in an easy and secure way.

To obtain an even more secure attachment to an electrical device the electrical module may comprise two locking device. This provides the advantage that the module is prevented from movement by turning.

Said at least one direction may include a direction which is opposite to said linear movement of the first part along said first axis.

Said at least one direction may include a direction which is opposite to the direction in which the first electrical interface is directed. This provides the advantage that the electrical interface is not exposed to forces that may damage or disconnect the electrical interface.

To obtain an electrical module that may interact with a further electrical device, or a network, it may comprise a second electrical interface that is connectable to a second electrical device.

The electrical module may further comprise a projection adapted to define an attachment position of said module in relation to said electronic device, in which attachment position said second part is movable by turning to said locking position for engagement with said electrical device. The projections provide an even more secure and easy attachment of the module to a device and provide the advantage that the module is prevented from movement in a further direction. Depending on the shape of the projection, the module may be prevented from movement in all directions.

Said second part of the electrical module may be freely supported in said locking device. This provides the advantage that the second part does not need a physical axle that is supported in the module. This also provides the advantage that the dimension of the locking device of the module may be minimised.

By freely supported is meant that the second part rests on a recess and is not only supported by a physical axle.

To obtain a second part without a physical axle in an easy, secure and effective way, the second part of the electrical module may comprise a cam portion that has the shape of an arc.

The first part of the electrical device may comprise a screw. This provides the advantage that there is no need of a special tool to move the first part. Also, the second part is locked in its locking position in an easy and secure way.

Another aspect of the present invention relates to a method of attaching an electrical module according to the invention to an electrical device, comprising the steps of positioning the electrical module in relation to the electrical device, moving the first part in a linear direction and thereby causing the second part to turn and engage an abutment device of the electrical device for preventing movement of the electrical module in relation to the electrical device in at least one direction.

Thus, a method of attaching the inventive electrical module to an electrical device is obtained that provides the above stated advantages of the inventive electrical module.

Another aspect of the present invention relates to a system comprising an electrical module and an electrical device. The system is characterised in that the electrical module is an electrical module according to the invention and that the electrical device comprises an abutment device with which said second part of the locking device is adapted to engage when in its locking position.

Thus, also a system is obtained that provides the above stated advantages of the inventive electrical module.

Hereafter one embodiment of the present invention is described, by way of example, with reference to the accompanying drawings.

DETAILED DESCRIPTION OF PREFERRED EMBODIMENTS

Figure 1:
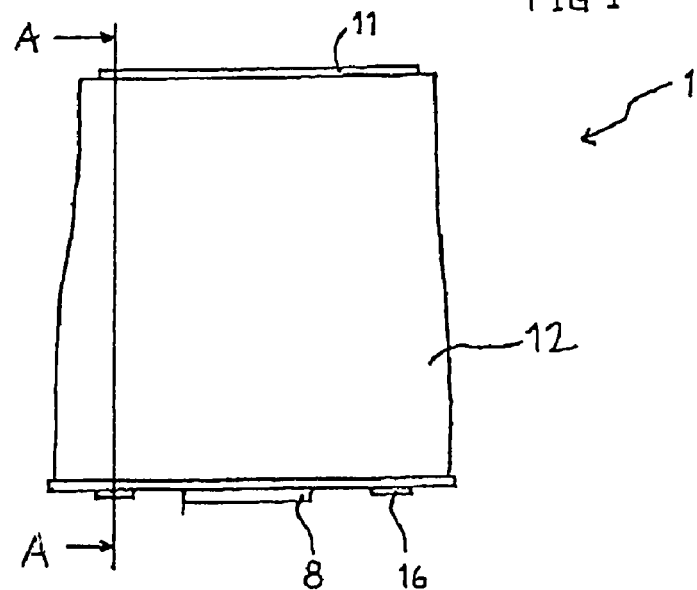
FIG. 1 is a view from above of an electrical module according to the present invention.
Figure 2:
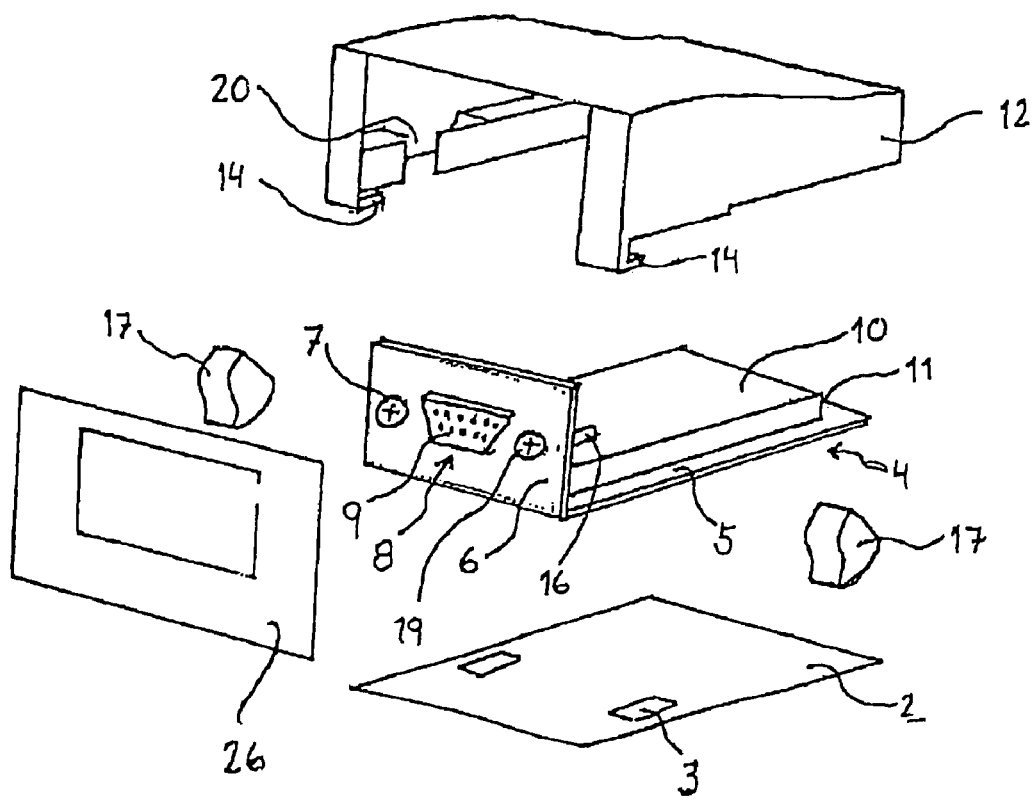
FIG. 2 is an exploded view of an electrical module in accordance with the invention.

FIGS. 1 and 2 disclose an electrical module 1 in the form of a communication unit 1. The communication unit 1 may by way of example be used as an interface between a computer and a network. However, it should be understood that the electrical module 1 could constitute many other modules, such as a portable memory, a portable CD-ROM writer etc.

The communication unit 1 can be attached and connected to an electrical device such as a computer, not disclosed. On one side the communication unit 1 is connectable to an electrical device and a second side is connectable to a further electrical device, such as a machine, a network or a second computer.

The communication unit 1 comprises a bottom plate 2 including two holes 3. A base 4 with the shape of a lying L is fastened on the bottom plate 2. The base 4 comprises a horizontal plate 5 and a vertical plate 6. The communication unit 1 also comprises electronic equipment 10 which in one way or another process the information from said devices. The electronic equipment 10 is mounted on the horizontal plate 5 of the base 4. Further, the vertical plate 5 of the base 4 comprises a trough hole 7. The communication unit also comprises a first and a second electrical interface 11, 8, which are connected to the electrical equipment 10. The first electrical interface 11 is mounted on the horizontal plate 5 at the other end of said horizontal plate 5, opposite to the vertical plate 6. The second electrical interface 8 is mounted on the vertical plate 6 and it extends from one side of the vertical plate 6 to the other. The second electrical interface 8 has on the outer side a contact 9. Thus, the communication unit 1 may be connected to two different electrical devices at the same time.

A housing 12 is mounted on top of the bottom plate 2. The housing 12 and the bottom plate 2 surround the electronic equipment 10. The housings 12 may also comprise grooves, not disclosed, in which the electrical device may be inserted to improve the attachment of the electrical module.

The housing 12 comprises two projections 14. The projections are mounted on the side of the housing 12 that is directed towards the bottom plate 2. The projections 14 has an L-shape that is directed downwards and backwards against the first electronic interface 11, so that they are able to restrict movements in these directions. However, it should be understood that the projections 14 may have many other shapes and still obtain similar effects. As an example, the projections could have a shape being able to prevent the communication unit 1 from movement in three directions.

The communication unit 1 also comprises a flange plate 26. The flange plate 26 is attached to the vertical plate 6 on the side of the vertical plate 26 that is directed away from the electrical equipment 10. The flange plate 26 reinforces the communication unit 1 and protects it from external forces.

Further, the communication unit 1 comprises two locking device 15, which are able to attach the communication unit 1 to an electrical device. The locking device 15 are located on each side of the communication unit 1, so that it can be attached to the electrical device and prevent movement in the same direction as the first electronic interface 11 is directed. The locking device 15 comprises a first part 16 and a second part 17.

In the disclosed embodiment the first part 16 is a screw 16, to be inserted in a threaded hole 18 in the vertical plate 6 of the base 4. The screw 16 comprises a screw head 19 which is directed away from the electrical equipment 10 of the communication unit 1. It should be understood that the invention is not restricted to screws. The first part 16 may be constituted from many other fastening means that have the characteristics of that they can be moved in a linear direction and be locked in different positions.

The second part 17 has the general shape of two interconnected circular segments. The second part 17 is freely supported in a recess 20 inside of the housing 12, such that it may be turned about a geometrical axis. The shape of the recess 20 may define the turning ability of the second part 17. When the first part 16 engage the second part 16 it pushes the second part 17 against the recess 20 such that it is forced to turn about said axis. It is however not necessary that the second part 17 is freely supported in the housing 12, it may also be supported via an axle.

Figure 3:
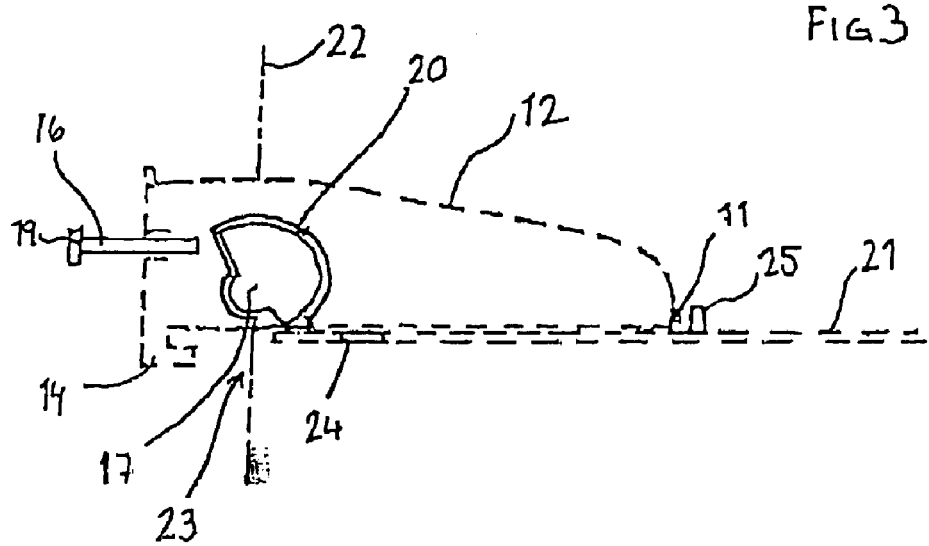
FIGS. 3-5 are cross sectional views of the inventive electrical module along the line A-A in FIG. 1, showing the locking of the electrical module to an electrical device.
Figure 4:
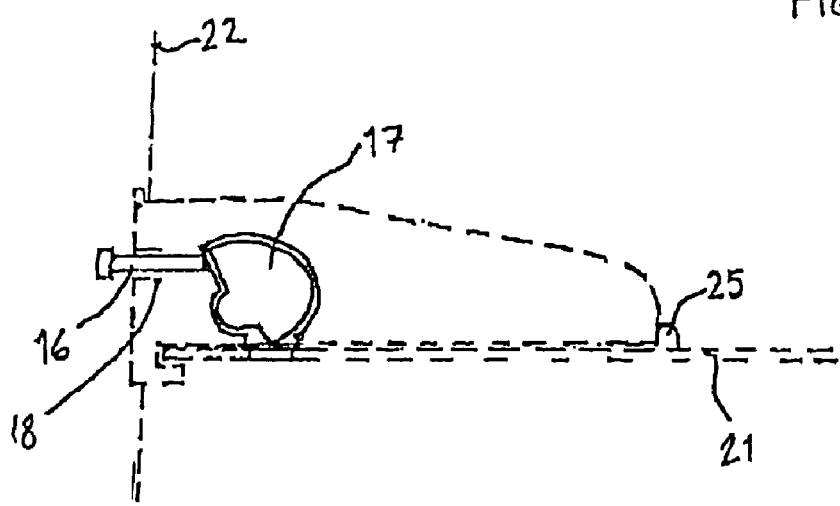
Figure 5:
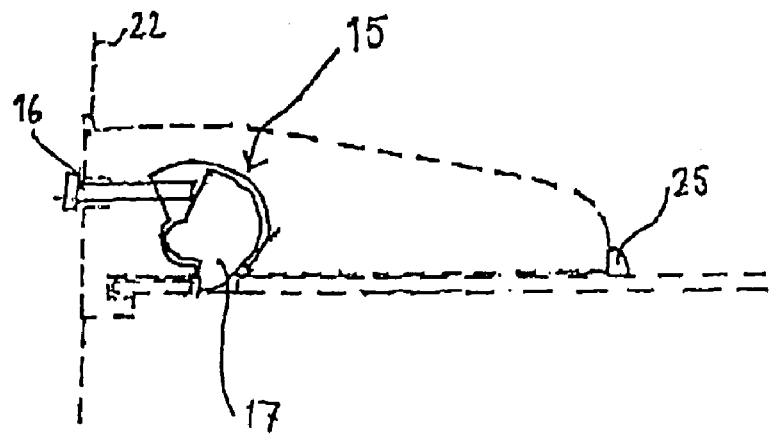

FIGS. 3 to 5 discloses the attachment of the communication unit 1 to an electrical device. In the disclosed embodiment the electrical device is a printed circuit card 21. An exterior wall 22, of for example a computer, comprising an opening 23 surrounds the printed circuit card 21.

The printed circuit card 21 comprises two edges 24 and an electrical interface 25, which is adapted to be connected to the first electrical interface 1 of the communication unit 1.

The communication unit 1 is inserted in the opening 23 of the exterior 22 and located on the printed circuit card 21. Further, the communication unit 1 is pressed inwards in respect of the opening 23 so that the projections 14 of the housing make contact with one side of the printed circuit card 21 and the second part is located over the edges 24 on the printed circuit card 21. In this position the first electrical interface 11 of the communication unit 1 also makes contact with the corresponding electrical interface 25 of the printed circuit card 21.

Hereafter the screw 16 is tightened so that it moves inwardly. The screw 16 makes contact with an upper side of the second part 17. As the screw 16 moves further inwards, the second part 17 turns around an axis, not showing, which is located between the screw 16 and the printed circuit card 21. The turning of the second part 17 around said axis results in that a portion of the second part 17 protrude through the hole in the bottom sheet 2 and makes contact with the edge 24 of the printed circuit card 21. The further turning of the second part 17 as a response to the movement of the screw pushes the communication unit 1 further on to the printed circuit card 21. This movement make the side of the printed circuit card 21 to be positioned on the projections 14 and ensures that the electrical interfaces 11, 25 of the communication unit 1 and the printed circuit card 21 are properly connected.

Thus, in this position the second part 17 and the projections prevents movement of the printed circuit card 21 in relation to the communication unit 1. The screw 16 and the housing 12 secure the second part 17 so that it is unable to move.

However, it should be understood that it is not necessary that the second part 17 pushes the communication unit 1 inwardly, this may also be done in other ways and thereafter the second parts 17 attach the communication unit 1 to the electronic device.

If the communication unit 1 should be removed from the printed circuit card 21, the screws 16 are unscrewed in the opposite direction. Thereafter, there is nothing that prevents movement of the second parts 17 and as the communication unit 1 is pulled backwards through the opening 23 of said exterior 22 the second parts 17 turns so that they disengage the edges 24. The second parts 17 may also be preloaded so that they turn and disengage the edges 24 when the screws are unscrewed.

Further, the communication unit may thereafter be attached and connected to another electrical device.

This invention has been disclosed in terms of an embodiment. It will be apparent that many modifications may be made to the disclosed electrical module without departing from the invention. Therefore, the present inventions should be considered limited only by the scope of the claims.

The invention claimed is:

1. An electrical module, comprising:
   a first electrical interface, said module being attachable to an electrical device for connecting said first electrical interface to said device; and
   at least one locking device adapted to prevent movement of said module in relation to said electrical device in at least one direction, said locking device comprising,
   a first part which is movable along a first axis and a second part which is turnable about a second axis, wherein the first part is adapted to push the second part,
   the second part being movable to a locking position by turning about said second axis in response to linear movement of the first part along said first axis, said second axis having an extension which is different from the extension of said first axis, and
   said second part being adapted for engagement with said electrical device in said locking position,
   said module further comprising an engagement portion adapted to define an attachment position of said module in relation to said electrical device, in which attachment position, said second part is movable by turning to said locking position for engagement with said electrical device.

2. An electrical module as claimed in claim 1, comprising two locking devices.

3. An electrical module as claimed in claim 1, wherein said at least one direction includes a direction which is opposite to said linear movement of the first part along said first axis.

4. An electrical module as claimed in claim 1, wherein said at least one direction includes a direction which is opposite to the direction in which the first electrical interface is directed.

5. An electrical module as claimed in claim 1, further comprising a second electrical interface that is connectable to a second electrical device.

6. An electrical module as claimed in claim 1, further comprising a projection adapted to define an attachment position of said module in relation to said electrical device, in which attachment position, said second part is movable by turning to said locking position for engagement with said electrical device.

7. An electrical module as claimed in claim 1, wherein said second part is freely supported in said locking device.

8. An electrical module as claimed in claim 1, wherein the second part comprises a cam portion that has the shape of an arc.

9. An electrical module as claimed in claim 1, in which the first part is a screw.

10. Method of attaching an electrical module according to claim 1 to an electrical device, comprising the steps of
    positioning the electrical module in relation to the electrical device, and
    moving the first part in a linear direction and thereby causing the second part to turn and engage an abutment device of the electrical device for preventing movement of the electrical module in relation to the electrical device in at least one direction.

11. System comprising
    an electrical module and an electrical device, wherein the electrical module is an electrical module according to claim 1 and wherein the electrical device comprises an abutment device with which said second part of the locking device is adapted to engage when in its locking position.

12. An electrical module as claimed in claim 2, wherein said at least one direction includes a direction which is opposite to said linear movement of the first part along said first axis.

13. An electrical module as claimed in claim 2, wherein said at least one direction includes a direction which is opposite to the direction in which the first electrical interface is directed.

14. An electrical module as claimed in claim 3, wherein said at least one direction includes a direction which is opposite to the direction in which the first electrical interface is directed.

15. An electrical module as claimed in claim 2, further comprising a second electrical interface that is connectable to a second electrical device.

16. An electrical module as claimed in claim 2, further comprising a projection adapted to define an attachment position of said module in relation to said electrical device, in which attachment position, said second part is movable by turning to said locking position for engagement with said electrical device.

17. An electrical module as claimed in claim 2, in which the first part is a screw.

18. Method of attaching an electrical module according to claim 2 to an electrical device, comprising the steps of
    positioning the electrical module in relation to the electrical device, and
    moving the first part in a linear direction and thereby causing the second part to turn and engage an abutment device of the electrical device for preventing movement of the electrical module in relation to the electrical device in at least one direction.

19. System comprising
    an electrical module and an electrical device, wherein the electrical module is an electrical module according to claim 2 and wherein the electrical device comprises an abutment device with which said second part of the locking device is adapted to engage when in its locking position.

* * * * *